United States Patent [19]

Wadell

[11] Patent Number: 4,864,077
[45] Date of Patent: Sep. 5, 1989

[54] SHIELDED ENCLOSURE
[75] Inventor: Brian C. Wadell, Reading, Mass.
[73] Assignee: Teradyne, Inc., Boston, Mass.
[21] Appl. No.: 205,217
[22] Filed: Jun. 10, 1988
[51] Int. Cl.$^4$ .............................................. H05K 9/00
[52] U.S. Cl. .................................. 174/35 R; 361/424
[58] Field of Search .................. 174/35 R, 35 MS; 361/424; 250/506.1

[56] References Cited
U.S. PATENT DOCUMENTS

| 3,641,464 | 2/1972 | Crowhurst et al. | 174/35 R |
| 4,313,025 | 1/1982 | Grube, Jr. | 174/50 |
| 4,370,700 | 1/1983 | Duddles et al. | 361/424 |
| 4,456,827 | 6/1984 | Botzem et al. | 250/506.1 |
| 4,567,014 | 1/1986 | Popp et al. | 376/272 |
| 4,626,380 | 12/1986 | Baatz et al. | 250/506.1 |
| 4,658,439 | 4/1987 | Danielsen | 455/301 |
| 4,758,689 | 7/1988 | Nakao et al. | 174/52 R |

OTHER PUBLICATIONS

Moochalla, S. S., Semicircular Dome Housing for a Radio Frequency Amplifier; Technical Notes; Publication of RCA, Princeton, NJ, TN 1344, Mar. 15, 1984.

Primary Examiner—Morris H. Nimmo

[57] ABSTRACT

A shielded enclosure for electronic devices utilizing alternating current signals, the enclosure having first and second storage members that have a geniculated (i.e., abrupt angle) junction between them so as to inhibit transmission of alternating current radiation from the devices.

11 Claims, 2 Drawing Sheets

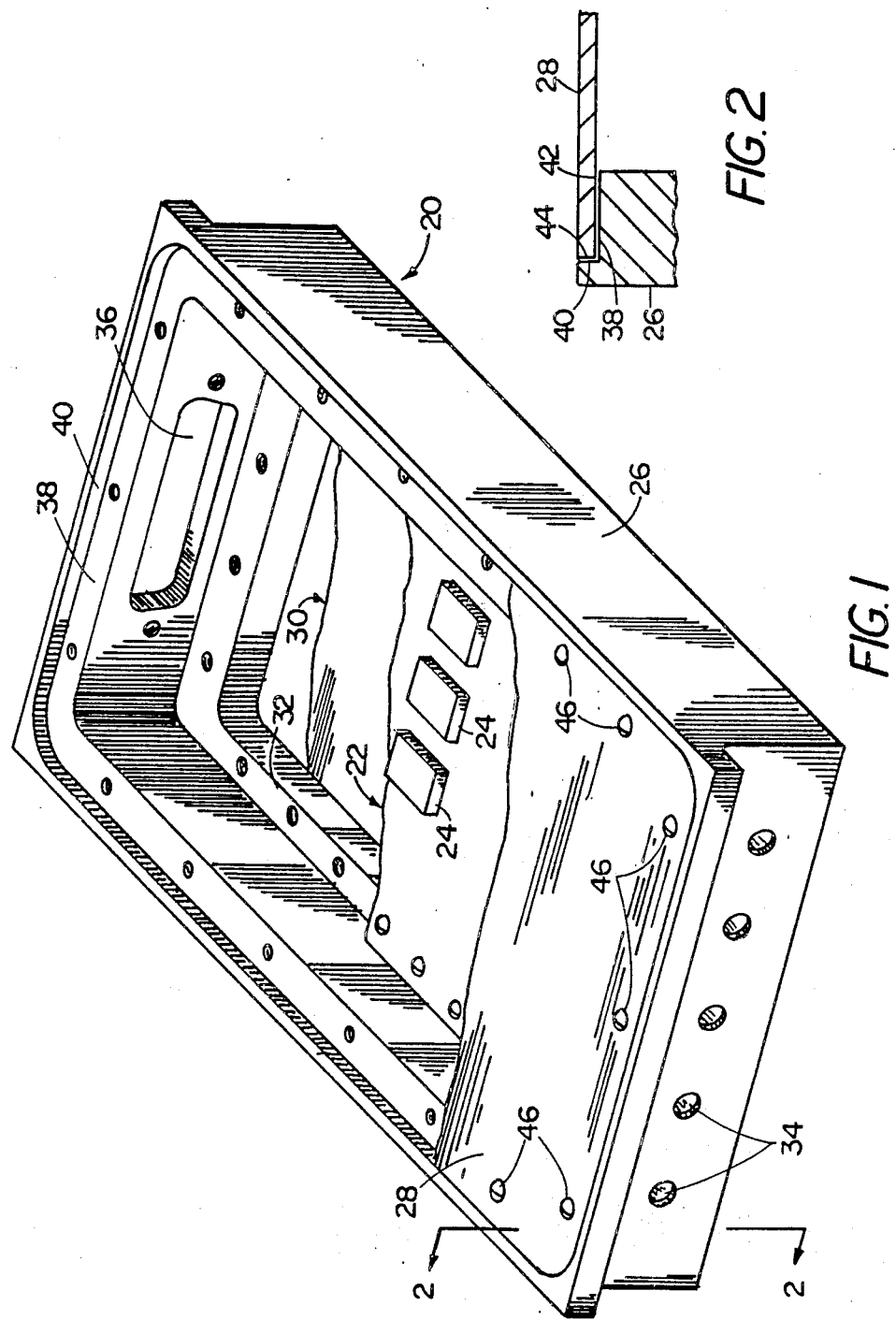

SHIELDED ENCLOSURE

FIELD OF THE INVENTION

The present invention relates to shielded enclosures for alternating current electronic circuits.

BACKGROUND OF THE INVENTION

It is known in the art to shield circuitry which operates at high frequencies to prevent high-frequency radiation from interfering with other circuits. Shielding is accomplished by surrounding the circuitry with metal shielded enclosures, as disclosed, e.g., in U.S. Pat. No. 4,658,439.

In shielded enclosures, it may be desirable to provide good electrical connection between two members of the enclosure (e.g., a wall member and a cover) by having them mate at flat, smooth surfaces that are bolted up against each other around the junction between the two. Gaps in the shielded enclosure (e.g., at a junction), which limit the shielding effectiveness, can be blocked by providing a conductive, compressible gasket material in a precision groove formed in one member.

SUMMARY OF THE INVENTION

It has been discovered that, by providing a geniculated (i.e., abrupt angle) junction between first and second storage members that together make up an enclosure for electronic devices, transmission of alternating current radiation from the devices can be advantageously inhibited.

In preferred embodiments the first storage member is a top cover, and the second storage member is a wall member; the wall member has a recess for receiving the cover; the cover and wall member mate at opposing flat surfaces; the cover is secured to the wall member via a plurality of connector elements (e.g., bolts) between the two around the junction; there is a second recess on the wall member and a mating bottom cover; the wall member has an interior lip for supporting a circuit board; and there are holes in the wall member for receiving electrical connectors.

Other advantages and features of the invention will be apparent from the following description of a preferred embodiment thereof and from the claims.

DESCRIPTION OF THE PREFERRED EMBODIMENT

Figure 6:
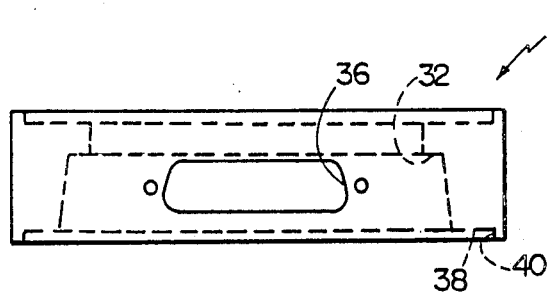
Figure 4:
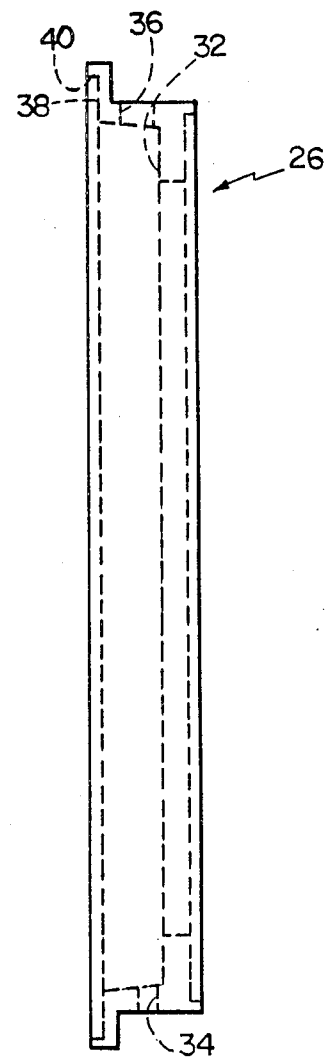
Figure 3:
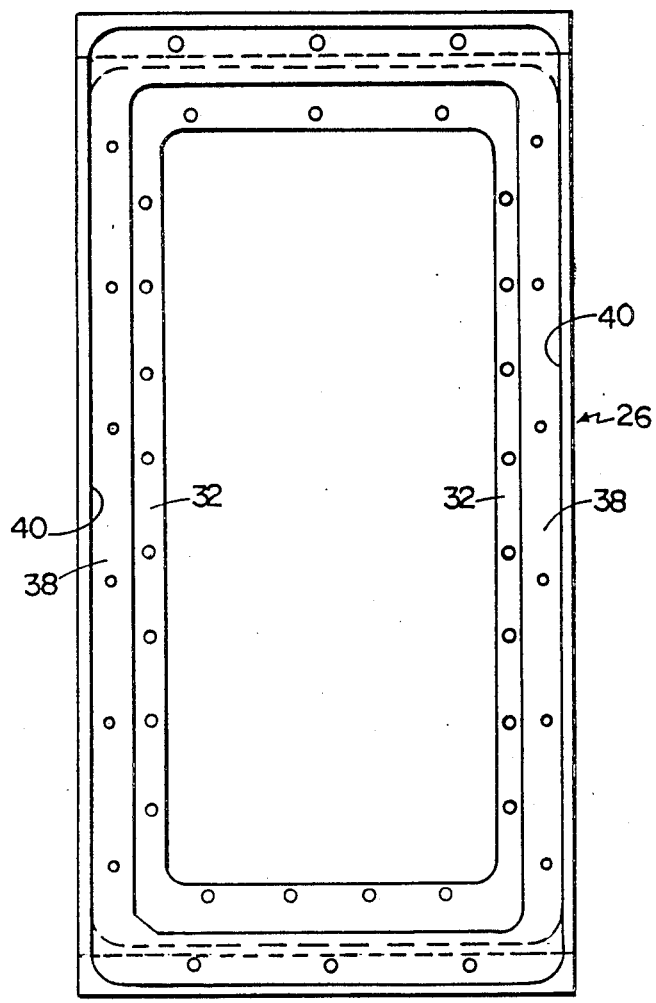
Figure 5:
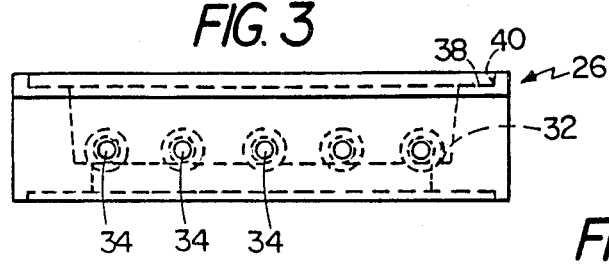

The preferred embodiment will now be described.
Drawings
FIG. 1 is a perspective view of a shielded enclosure according to the invention.
FIG. 2 is a partial sectional view, taken at 2—2 of FIG. 1.
FIG. 3 is a plan view of a wall member of the FIG. 1 enclosure.
FIG. 4 is a side elevation of the FIG. 3 wall member.
FIG. 5 is a front elevation of the FIG. 3 wall member.
FIG. 6 is a rear elevation of the FIG. 3 wall member.

STRUCTURE

Referring to the figures, shielded enclosure 20 completely surrounds electronic printed circuit board 22 having high-frequency, electronic devices 24 thereon. Shielded enclosure 20 includes wall member 26, top cover 28, and bottom cover 30, all made of aluminimum.

Wall member 26 includes lip 32 on which electronic printed circuit board 22 is bolted. Wall member 26 also has coaxial connector holes 34 and D-connector hole 36 into which coaxial connectors (not shown) and a filtered D-connector (not shown) are placed respectively. These electrical connectors are used to allow signals to be transmitted to and received from the electronic circuitry within enclosure 20 while preventing high-frequency radiation from escaping from enclosure 20.

Wall member 26 has surface 38 (about 0.42 inch wide along the longer side and about 0.47 inch wide along the shorter side) and perpendicular surface 40 (0.10 inch high), which together define a recess into which top cover 28 is received. Referring to FIG. 2, top cover 28 includes surface 42 and edge surface 44, which correspond to and mate with surfaces 38 and 40 of wall member 26. Wall member 26 and top cover 28 are made of cast aluminimum and are "tumbled" in sand or glass to provide polishing of surfaces. The casting process provides very flat surfaces 38, 42, permitting intimate contact of the two. Surface roughness is less than or equal to 63 microinches RMS. Surfaces 38, 42 are treated to provide good electrical conduction between them; in particular, the surfaces are degreased, caustic etched 0.0015" max and aluminum phosphate treated per MIL-C-10578D, Type III.

Cover 28 is tightly secured to wall member 26 via screws 46 around the periphery of cover 28, thereby providing good electrical connection between the two. Because of the flatness of surfaces 38, 42, the spacing between them is determined by surface roughness. The gap (i.e., on both sides) between surfaces 40, 44 is between 0.035" and 0.070". Wall member 26 includes a similar recess into which bottom cover 30 fits and is secured by a plurality of screws (not shown). The total gap between the side surfaces of bottom cover 30 and the opposing surfaces of the mating recess is between 0.055" and 0.062". The junctions between wall members 26 and recessed covers 28, 30 are geniculated, i.e., have abrupt (in particular 90°) angles.

Enclosure 20 thus includes a first storage member (top cover 28) with first (42) and second (44) surfaces, a second storage member (wall member 26) with third (38) and fourth (40) surfaces that mate with the first and second surfaces, and a third storage member (bottom cover 30) that fits in a recess at the bottom of the second storage member defined by fifth and sixth surfaces. The bottom cover has seventh and eighth surfaces that mate with the fifth and sixth surfaces.

OPERATION

Shielded enclosure 20 is used in automatic test equipment to enclose a high-frequency alternating current instrument. The bolting of printed circuit board 22 on lip 32 provides a good ground path for the electronic components. The only gaps on enclosure 20 are those at the geniculated junctions between wall member 26 and recessed covers 28, 30. The abrupt angle (preferably 90° or less) acts to inhibit high-frequency radiation from escaping from enclosure 20, as do the small gap between surfaces 38, 42 (determined by the roughness) and the small gap between surfaces 40, 44 (determined by the tolerances of covers 28, 30 and the recess on wall member 26). The geniculated junctions of enclosure 20 are designed to inhibit high frequency radiation in the range 1 megahertz to 10 gigahertz from escaping from shielded enclosure 20. Enclosure 20 has advantages over the prior use of gaskets in avoiding the cost of the gasket material, the precision machined groove and labor, and in avoiding the loss of gasket effectiveness after multiple compressions.

OTHER EMBODIMENTS

Other embodiments of the invention are within the scope of the following claims. E.g., the junction between the wall member recess and the corresponding cover may have a plurality of abrupt angles in it to provide increased shielding over a single abrupt angle. As the frequencies of signals to be inhibited increase, or as the desired shielding effectiveness increases, the gaps will have to be made smaller and/or the number of abrupt angles will have to be increased in order to restrict the passage at the junction and effectively inhibit transmission of the alternating current radiation from the electronic devices. Also, other conductive materials such as brass or copper could be used in place of aluminum.

What is claimed is:

1. A shielded enclosure assembly comprising
   devices utilizing high frequency alternating current signals and generating alternating current radiation,
   a first storage member having a first surface and a second surface,
   a second storage member having a third surface mating with said first surface and a fourth surface mating with said second surface, and
   a plurality of connector elements uniformly positioned around the periphery of said first storage member to secure said first storage member to said second storage member and to provide intimate contact between the two, said intimate contact having a spacing that is determined by surface roughness of said first surface and said third surface,
   said enclosure surrounding said devices,
   said first and second surfaces forming a geniculated junction with said third and fourth surfaces, said geniculated junction and said spacing serving to inhibit transmission of said alternating current radiation from said devices.

2. The shielded enclosure of claim 1 wherein said first storage member comprises a first cover and said second storage member comprises a wall member.

3. The shielded enclosure of claim 1 wherein said third and fourth surfaces define a recess into which said cover is placed.

4. The shielded enclosure of claim 2 wherein said second storage member also has fifth and sixth surfaces, and further comprising
   a third storage member having a seventh surface mating with said fifth surface and an eighth surface mating with said sixth surface,
   said fifth and sixth surfaces forming a geniculated junction with said seventh and eighth surfaces so as to inhibit transmission of alternating current radiation from said devices.

5. The shielded enclosure of claim 4 wherein said third storage member comprises a second cover that fits within a second recess defined by said fifth and sixth surfaces.

6. The shielded enclosure of claim 2 wherein said second storage member has a lip, and said devices utilizing alternating current signals are carried by a circuit board that is mounted on said lip.

7. The shielded enclosure of claim 3 wherein said second storage member defines holes for receiving connectors which transmit signals to and receive signals from said devices.

8. The enclosure of claim 1 wherein said first and third surfaces are flat surfaces.

9. The enclosure of claim 8 wherein said flat surfaces have a surface roughness less than or equal to about 63 microinches RMS.

10. The enclosure of claim 9 wherein said devices utilizing alternating current signals operate in the range from 1 megahertz to 10 gigahertz.

11. The enclosure of claim 9 wherein said third surface is about 0.5 inch wide.

* * * * *